(12) United States Patent
Liu et al.

(10) Patent No.: US 8,948,480 B2
(45) Date of Patent: Feb. 3, 2015

(54) IMAGE RECONSTRUCTION USING REDUNDANT HAAR WAVELETS

(75) Inventors: Jun Liu, Plainsboro, NJ (US); Jeremy Rapin, Paris (FR); Alban Lefebvre, Jersey City, NJ (US); Mariappan S. Nadar, Plainsboro, NJ (US); Ti-chiun Chang, Princeton Junction, NJ (US); Michael Zenge, Nürnberg (DE); Edgar Müller, Heroldsbach (DE)

(73) Assignee: Siemens Aktiengesellschaft, Munich (DE)

( * ) Notice: Subject to any disclaimer, the term of this patent is extended or adjusted under 35 U.S.C. 154(b) by 178 days.

(21) Appl. No.: 13/616,484

(22) Filed: Sep. 14, 2012

(65) Prior Publication Data

US 2013/0121554 A1 May 16, 2013

Related U.S. Application Data

(60) Provisional application No. 61/558,067, filed on Nov. 10, 2011, provisional application No. 61/558,074, filed on Nov. 10, 2011.

(51) Int. Cl.
| | |
|---|---|
| *G06K 9/00* | (2006.01) |
| *G06T 11/00* | (2006.01) |
| *G01R 33/561* | (2006.01) |
| *G01R 33/48* | (2006.01) |
| *G01R 33/563* | (2006.01) |

(52) U.S. Cl.
CPC .......... *G06T 11/005* (2013.01); *G01R 33/5619* (2013.01); *G01R 33/482* (2013.01); *G01R 33/5611* (2013.01); *G01R 33/56308* (2013.01)
USPC ........................................................ 382/128

(58) Field of Classification Search
None
See application file for complete search history.

(56) References Cited

U.S. PATENT DOCUMENTS

| | | | | |
|---|---|---|---|---|
| 7,602,183 | B2 * | 10/2009 | Lustig et al. | 324/309 |
| 7,688,068 | B2 * | 3/2010 | Beatty | 324/307 |
| 7,917,190 | B2 * | 3/2011 | Mistretta et al. | 600/410 |
| 8,111,893 | B2 * | 2/2012 | Chen et al. | 382/131 |
| 2005/0058368 | A1 * | 3/2005 | Moriguchi et al. | 382/280 |
| 2005/0100202 | A1 * | 5/2005 | Huang | 382/128 |
| 2007/0167728 | A1 * | 7/2007 | Mistretta et al. | 600/410 |
| 2008/0194946 | A1 * | 8/2008 | Summers et al. | 600/425 |
| 2008/0221433 | A1 * | 9/2008 | Doyle | 600/422 |
| 2008/0228446 | A1 * | 9/2008 | Baraniuk et al. | 702/189 |
| 2008/0292163 | A1 * | 11/2008 | DiBella et al. | 382/131 |
| 2011/0058719 | A1 * | 3/2011 | Trzasko et al. | 382/131 |
| 2012/0148129 | A1 * | 6/2012 | Chang et al. | 382/131 |
| 2013/0099786 | A1 * | 4/2013 | Huang et al. | 324/309 |

FOREIGN PATENT DOCUMENTS

CN             102024266 A    *   4/2011

\* cited by examiner

*Primary Examiner* — Nirav G Patel
*Assistant Examiner* — Oneal R Mistry

(57) ABSTRACT

A method for image reconstruction includes receiving under-sampled k-space data, determining a data fidelity term of a first image of the under-sampled k-space data in view of a second image of the under-sampled k-space data, wherein a time component separated the first image and the second image, determining a spatial penalization on redundant Haar wavelet coefficients of the first image in view of the second image, and optimizing the first image according the data fidelity term and the spatial penalization, wherein the spatial penalization selectively penalizes temporal coefficients and an optimized image of the first image is output.

13 Claims, 4 Drawing Sheets

IMAGE RECONSTRUCTION USING REDUNDANT HAAR WAVELETS

CROSS-REFERENCE TO RELATED APPLICATION

This is a non-provisional application claiming the benefit of U.S. provisional application Ser. No. 61/558,067, filed Nov. 10, 2011, and U.S. provisional application Ser. No. 61/558,074, filed Nov. 10, 2011, the contents of which are incorporated by reference herein in their entirety.

BACKGROUND

1. Technical Field

The present disclosure relates to image reconstruction, and more particularly to methods for image reconstruction using redundant Haar wavelets.

2. Discussion of Related Art

Magnetic Resonance Imaging (MRI) is a well-established medical diagnostic tool for imaging structures within a body of a patient. Image quality may be characterized by parameters including resolution, field of view (FOV), contrast, edge definition, and artifacts, including ghosts and streaks. Under a broad range of conditions, image quality improves with increasing data acquisition time. If the data acquisition time is increased, however, the patient is subjected to a longer scan time, which increases patient discomfort. In some instances, long scan times may degrade image quality because of movement of the region of interest during the scan, such as in cardiac applications. In these cases short scan times may be needed for near-real-time measurements.

Parallel imaging has been used in magnetic resonance imaging in the last decade. It exploits the difference in sensitivities between individual coil elements in a receive array to reduce the number of gradient encodings required for imaging, and the increase in speed comes at a time when other approaches to acquisition time reduction were reaching engineering and human limits Cardiac Magnetic Resonance Imaging (CMRI) is a time-resolved imaging technology for non-invasive assessment of the function and structure of the cardiovascular system. High spatial and/or temporal resolution is often desired in CMRI.

BRIEF SUMMARY

According to an embodiment of the present disclosure, a method for image reconstruction includes receiving under-sampled k-space data, determining a data fidelity term of a first image of the under-sampled k-space data in view of a second image of the under-sampled k-space data, wherein a time component separated the first image and the second image, determining a spatial penalization on redundant Haar wavelet coefficients of the first image in view of the second image, and determining a reconstruction of the first image according the data fidelity term and the spatial penalization, wherein the spatial penalization selectively penalizes temporal coefficients and a reconstructed image corresponding to the first image is output.

According to an embodiment of the present disclosure, an image reconstruction method using a weighted four dimension (4D) redundant Haar wavelet includes receiving under-sampled k-space data including 4D images, and determining a reconstruction of an image of the 4D images by solving a minimization of a function including a data fidelity term and a penalty term controlling an incorporation of piecewise constant structures in spatial and temporal directions.

According to an embodiment of the present disclosure, an image reconstruction method includes inputting k-space data, averaging the k-space data in a temporal direction to obtain an averaged k-space data, determining a coil-profile based on the averaged k-space data, updating a solution based on the k-space data, the averaged k-space data, and the coil-profile in view of a data fidelity term, converting the solution into an equivalent three-dimensional tensor, updating the equivalent three-dimensional tensor using a wavelet transformation, and outputting a reconstructed image corresponding to the equivalent three-dimensional tensor updated using the wavelet transformation.

According to an embodiment of the present disclosure, an image reconstruction method is embodied in a computer program product including instructions executable by a processor.

BRIEF DESCRIPTION OF THE DRAWINGS

Preferred embodiments of the present disclosure will be described below in more detail, with reference to the accompanying drawings.

DETAILED DESCRIPTION OF PREFERRED EMBODIMENTS

According to an embodiment of the present disclosure, $L_1$ regularization based on weighted 3D Haar wavelets can be used for dynamic CMRI reconstruction. Further, a weighted 4D redundant Haar wavelet may be used for reconstruction from under-sampled k-space data acquired by a spiral phyllotaxis pattern.

Figure 1:
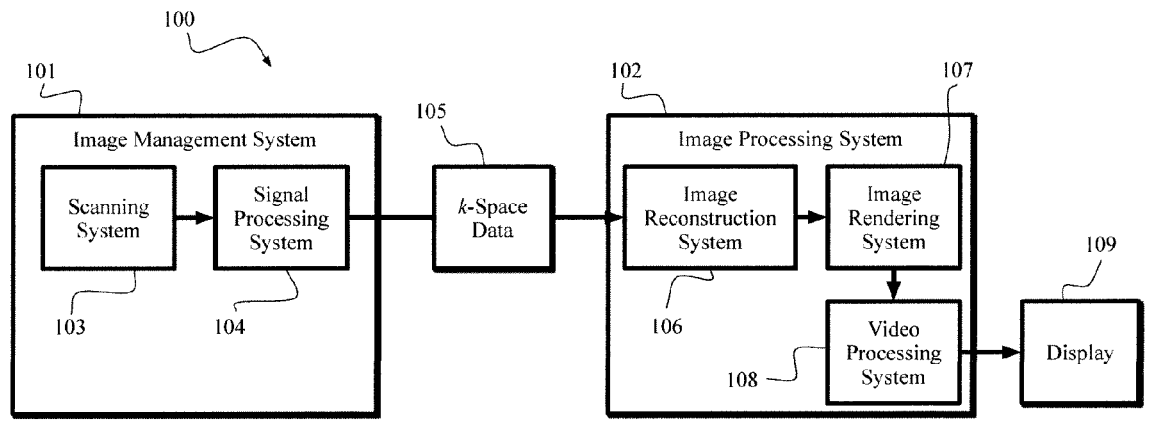
FIG. 1 shows an architecture of an exemplary imaging system according to embodiments of the present disclosure.

FIG. 1 shows a high-level schematic of the functional architecture of an exemplary imaging system according to an embodiment of the present disclosure. The imaging system is MRI system 100. Embodiments apply to other modalities of tomography, including Computed Tomography (CT), Positron Emission Tomography (PET) and the like. The MRI system 100 comprises an image measurement system 101, an image processing system 102, and a display 109. The image measurement system 101 may include a scanning system 103 and a signal processing system 104. The scanning system 103 includes the MRI scanner and associated instrumentation and software. The scanning system 103 outputs a radio-frequency (RF) signal to the signal processing system 104. The signal processing system 104 includes hardware and software, including processors, which converts the RF signals to the k-space data 105.

The k-space data 105 may by output to the image processing system 102, which may include an image reconstruction system 106, an image rendering system 107, and a video processing system 108. The image reconstruction system 106 transforms the k-space data 105 into image-space data, which may be a 2-D or 3-D dataset. Image reconstruction refers to the transformation of k-space data to image-space data. The image-space data may be mapped by image rendering system 107 into optical data for further video processing. For example, in a monochrome display, the image-space data may be mapped into the luminance values of pixels. In a color display, image-space data may be mapped into the luminance and false-color values of pixels. Video processing system 108 transforms the output optical data from image rendering system 107 into signals for driving pixels on display 109, which displays the image.

Herein, k-space is the 2D or 3D Fourier transform of the MRI measured in the image space. The values of k-space are sampled in a premeditated scheme controlled by a pulse sequence. The image space and the k-space are typically denoted by matrices or high-dimensional tensors. Each tensor is a generalization of 2D matrix, and a 2D matrix can be regarded as tensor with two modes. For example, for a 2D image of size 256×256, the image space is represented by a 2D matrix of size 256×256, and the k-space data can be represented by a 3D tensor of size 256×256×30 when 30 coils are used. For 20 3D images of size 256×256×64, the image space is the tensor of size 256×256×64×20, and the corresponding k-space data can be represented by the tensor of size 256×256×64×20×30.

Note that the image size is given in units of millimeters (mm) unless otherwise indicated.

Referring to the dynamic cardiac MRI reconstruction using an $L_1$ regularization based on the weighted 3D redundant Haar wavelet, dynamic images may be treated as a 3D tensor, and the weighted 3D wavelets may be imposed for incorporating smoothness in both spatial and temporal directions. For example, for 20 dynamic cardiac MR images of size 256×256, the dynamic images may be represented as a tensor of size 256×256×20. By applying the weighted 3D redundant Haar wavelet, the spatial smoothness of each 256×256 2D images may be taken to consideration, and the smoothness among the adjacent 2D images are also enforced.

A Haar wavelet is a sequence of rescaled square-shaped functions, which together form a wavelet family or basis. Wavelet analysis allows a target function over an interval to be represented in terms of an orthonormal function basis. To improve the representation of the smoothness, a redundant Haar wavelet may be used to capture changes in every pair of adjacent elements in the tensor.

Figure 2:
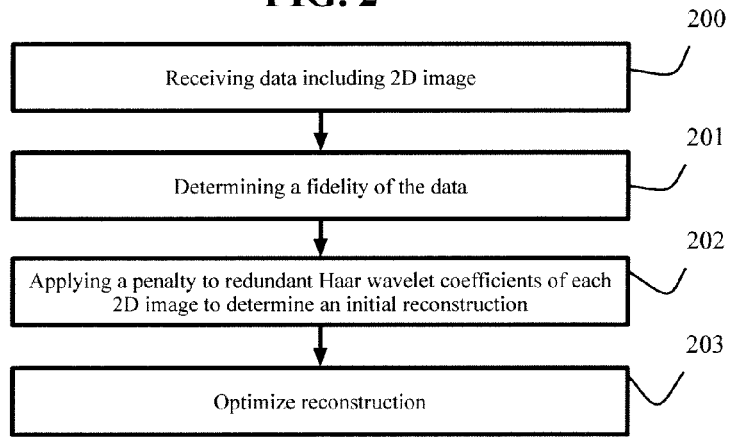
FIG. 2 is a flow diagram for dynamic cardiac MRI reconstruction according to embodiments of the present disclosure.

Referring to FIG. 2, an exemplary method for dynamic cardiac MRI reconstruction using an $L_1$ based on the weighted 3D redundant Haar wavelet includes receiving under-sampled k-space data, 201 determining a data fidelity term 202, an $L_1$ penalty 203, and an optimization 204.

Referring to the data fidelity term, let $x_t$ be the 2D image at time point t and x their concatenation into a 3D (2D+t) tensor, where the first two dimensions correspond to the spatial directions and the third dimension denotes the temporal direction. Let $s^c$ be the coil sensitivity map (CSM) for coil c (note that the individual coil elements have different sensitivities and parallel MR imaging exploits this difference to reduce the acquired data), ⊙ the component-wise product between two matrices, $s^c ⊙ x_t$ the coil image of coil c at temporal phase t. Let $\Phi_t$ represent the acquisition operator at time t, and $y_t^c$ the acquired k-space by coil c at time t. The data fidelity term can be written as:

$$f(x) = \frac{1}{2}\sum_{t=1}^{T}\sum_{c=1}^{C}\|y_t^c - \Phi_t(s^c \odot x_t)\|_2^2. \quad (1)$$

Referring to the $L_1$ penalty and weighted 3D redundant wavelets; a spatial penalization may be applied as an $L_1$ penalization of the redundant Haar wavelet coefficients of each 2D image, denoted by $\|W^{2D}x_t\|_1$. The redundant Haar wavelet coefficient is a difference between two neighboring resolution levels in the Haar wavelet transform. By enforcing the $L_1$ penalization, some values in $W^{2D}x_t$ are exactly zero, due to the sparsity, promoting ability of the $L_1$ norm. A zero in $W^{2D}x_t$ means that the corresponding difference between two neighboring image pixels is zero, and thus the solution $x_t$ tends to be piecewise constant.

To consider a temporal similarity between two consecutive images, the 3D wavelets may be used on the 2D+t data. In addition, since the acquisitions of temporal images are independent from each other, the high frequency temporal coefficients are selectively penalized. In this case, the high frequency temporal coefficients are more strongly penalized. Let $W^{3D}$ be the 3D wavelets, and $\lambda^{3D}$ the tensor of weights applied on the wavelet coefficients of x. The penalty may be given by:

$$p(x) = \|\lambda^{3D} \odot (W^{3D}x)\|_1, \quad (2)$$

where the high temporal frequencies were given a higher weights compared to the temporal low frequencies.

Referring to an exemplary optimization of the reconstruction; in a 3D wavelet approach, the dynamic images x may be obtained by:

$$\min_x f(x) + p(x). \quad (3)$$

The optimization problem (3) is convex but non-smooth, which adds to the difficulty of computation. Generally speaking, the non-smooth optimization problem is more difficult to solve as compared to a smooth optimization problem. To solve the non-smooth term, a proximal operator may be used in combination with Nesterov's approach (referred to hereinafter as the Nesterov-type acceleration method).

The Nesterov-type acceleration method is an extension of a gradient descent method and uses a proximal gradient method to reach a theoretically best convergence rate of a first-order method. To efficiently solve the proximal operator associated with the non-smooth penalty term p(x), the Dykstra-type method may be used.

The Dykstra method is an approach for solving the projection onto several convex sets, and is generalized here for dealing with the non-smooth penalty term p(x). For the Cartesian case, the operator Φ corresponds to the regular Fourier transform; and for the radial case, the operator Φ may be implemented as a non-uniform fast Fourier transform (NUFFT). For the coil profile Walsh's algorithm and a recent Eigen-Vector approach are used.

Referring to the weighted 4D redundant Haar wavelet for reconstruction from under-sampled k-space data acquired by a simulated spiral phyllotaxis pattern, an exemplary method exploits spatial sensitivity information of multiple coil elements and makes use of a regularization based on 4D redundant Haar wavelet transformation for incorporating both spatial and temporal structures to reconstruct image data (e.g., non-contrast-enhanced (NCE) 4D intracranial MR angiography (MRA)) from under-sampled k-space data.

Figure 3:
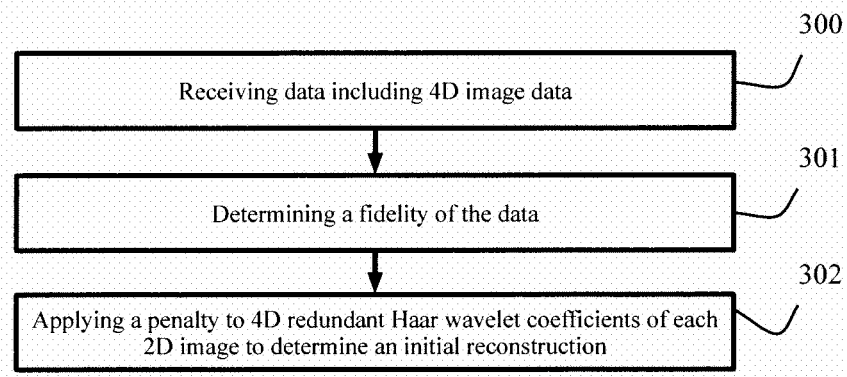
FIG. 3 is flow diagram for image reconstruction using weighted 4D redundant Haar wavelets according to embodiments of the present disclosure.

According to an embodiment of the present disclosure, in a method for weighted 4D redundant Haar wavelet for reconstruction, let X be a 4D tensor representing a target 4D difference image, where $X_i$ denotes the 3-dimensional difference image at temporal phase i. Referring to FIG. 3, a method for weighted 4D redundant Haar wavelet for image reconstruction may be applied to input data (e.g., 4D MRI images) 300 as a minimization of a function including a data fidelity term 301 and a penalty term 302 controlling the incorporation of piecewise constant structures in spatial and temporal directions.

Let $Y_i^j$ denote the difference of the under-sampled k-space data of the two acquisitions at temporal phase i by the j-th coil, where the sampling scheme used at temporal phase i is represented by the operator $P_i$. Let F denote the 3-dimensional Fourier transform, and $S_i^j$ be the 3-dimensional coil sensitivity map for the j-th coil at temporal phase i. Let W denote the 4-dimensional redundant Haar wavelet operator applied to a 4D tensor, and D be a 4D weight tensor. Let $\odot$ denote the Hadamard (or component-wise) product between two tensors. The 4D difference image X may be reconstructed by minimizing the following function:

$$\min_X \frac{1}{2} \sum_{i=1}^{t} \sum_{j=1}^{c} \|Y_i^j - P_i(F(S_i^j \odot X_i))\|_F^2 + \lambda \|D \odot (W(X))\|_1, \quad (4)$$

where the first term is the data fidelity depicting the discrepancy between the measured k-space data and the one that is estimated from X 301, and the second term is the penalty term incorporating the piecewise constant structures in both spatial and temporal directions 302.

Figure 4:
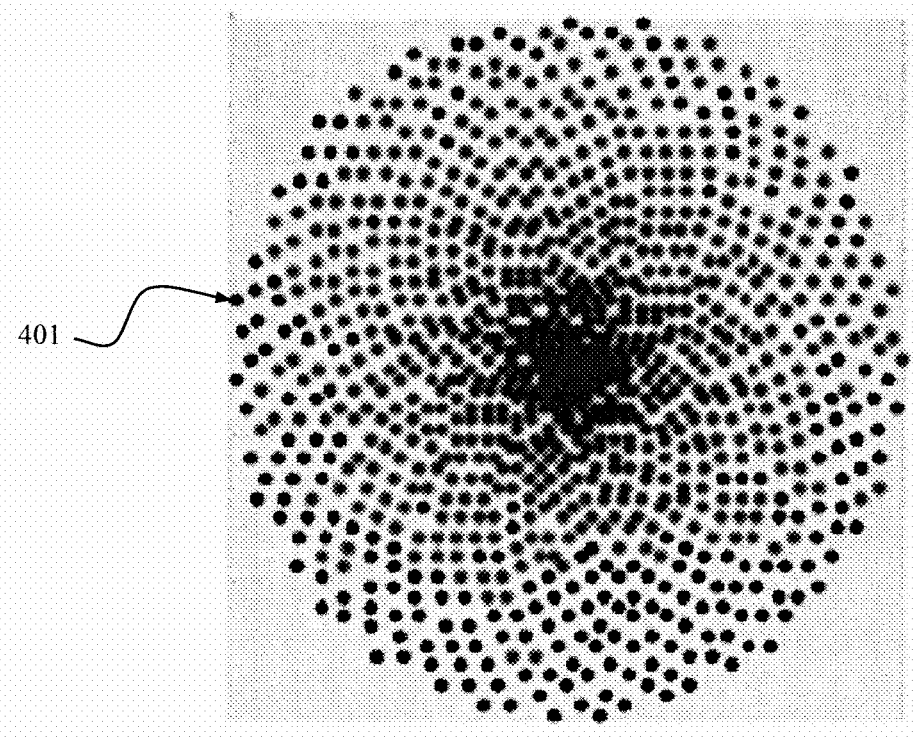
FIG. 4 is an under-sampled k-space sample according to embodiments of the present disclosure.

For the sampling operator $P_i$, the spiral phyllotaxis pattern may be used for retrospectively generating the readouts in the line-partition plane, with nearest neighbor interpolation onto a Cartesian grid as shown in FIG. 4.

FIG. 4 is an illustration of an under-sampled k-space samples, e.g., 401, in the line-partition plane by the spiral phyllotaxis pattern.

To incorporate the spatial and temporal structures 302, an $L_1$ regularization based on the 4D redundant Haar wavelet may be used. Redundant Haar wavelets have a line-partition plane and may also be used for 2D MRI reconstruction as described with reference to FIG. 2.

Higher weights may be imposed to the temporal direction, as the adjacent temporal phases are close to each other. In addition, zero weights may be imposed to the difference (and the mean) between the first phase and the last phase, as they turn out to be quite different. Like Eq. (3), Eq. (4) is a non-smooth convex optimization problem, and the aforementioned Nesterov's approach, together with Dykstra's algorithm for solving the proximal operator, may be used.

Nesterov's approach was an approach proposed for solving smooth convex optimization problems. The approach is a first-order approach in the sense that only the function value and the gradient is evaluated in each iteration, leading to an inexpensive per iteration cost. Nesterov's approach achieves a superior convergence rate as compared to many other first-order approaches; Nesterov's approach achieves a theoretically lower-complexity bound for first-order approaches. Nesterov's approach has been extended to solving the non-smooth convex optimization problem, achieving a substantially similar convergence rate. According to an exemplary embodiment of the present disclosure, a proximal operator may be used to deal with the non-smooth term. That is, the proximal operator associated with the weighted redundant Haar Wavelet may be solved for Eq. (3) and Eq. (4).

When the redundant Haar Wavelet is changed to the orthonormal Wavelet (in linear algebra, two vectors in an inner product space may be said to be orthonormal if they are orthogonal, having a dot product of 0), the associated proximal operator can be solved in closed form. However, the image quality obtained by the orthonormal Wavelet may be inferior to the weighted redundant Haar Wavelet used in Eq. (3) and Eq. (4). To solve the proximal operator associated with the redundant Haar Wavelet efficiently, the Dykstra's algorithm may be used.

The Dykstra's algorithm is a method that determines a point in the intersection of convex sets, and is a variant of the alternating projection method (also known as Projections onto Convex Sets method). In its simplest form, the method finds a point in the intersection of two convex sets by iteratively projecting onto each of the convex set; it differs from the alternating projection method in that there are intermediate steps. The Dykstra's algorithm may be used for solving an equivalent reformulation of the proximal operator associated with the redundant Haar Wavelet. To further improve the efficiency, a warm start may be added as a feature into the Dykstra's algorithm to achieve a high precision solution while reducing the number of Dykstra iterations.

Figure 5:
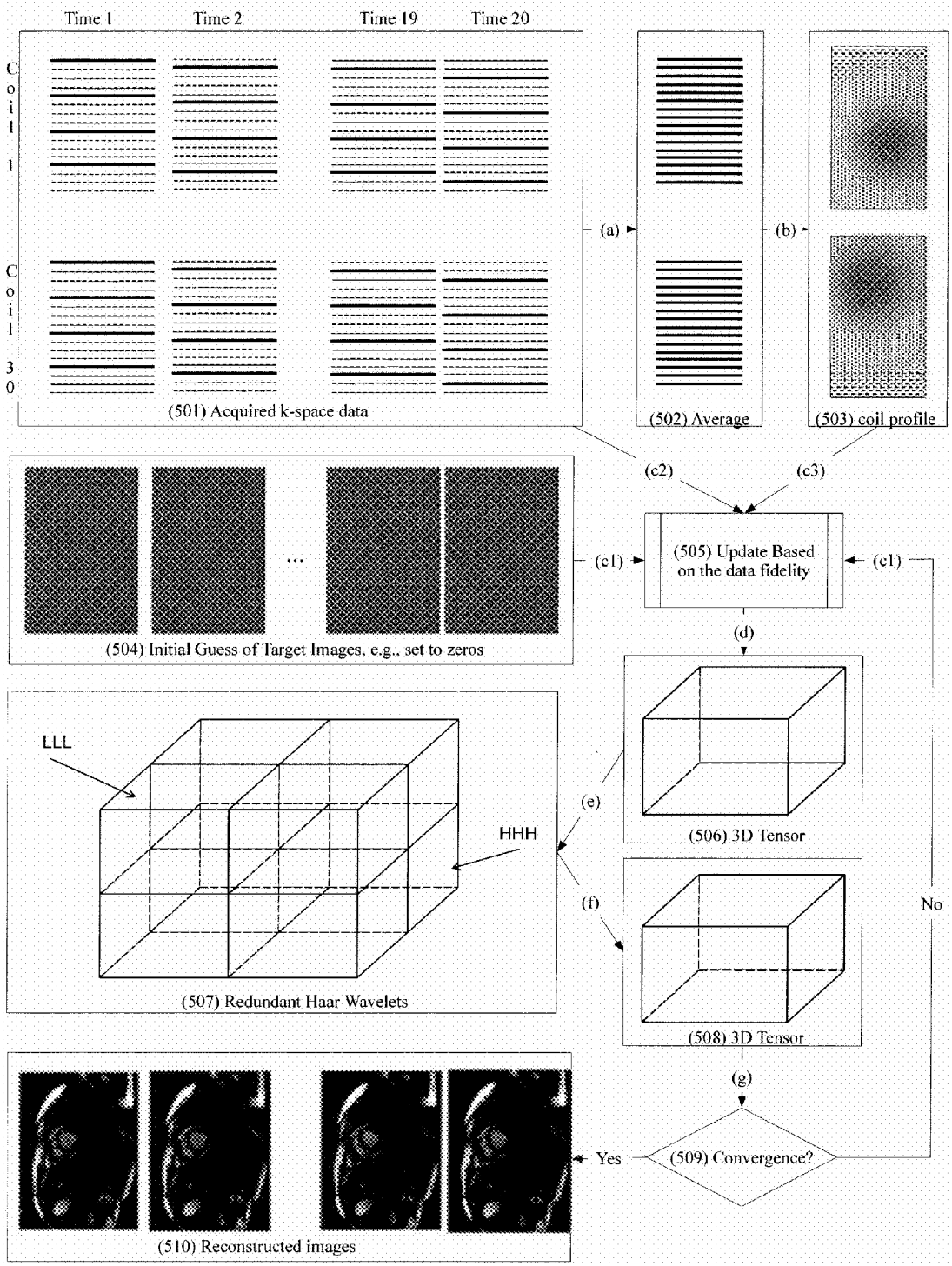
FIG. 5 is a flow diagram of an image reconstruction method according to an embodiment of the present disclosure.

FIG. 5 illustrates an exemplary reconstruction process. Block 501 shows k-space data acquired by 30 coils for 20 temporal phases. The k-space data is the input data to the reconstruction. For illustration, the k-space data is acquired in an interleaved way using Cartesian sampling. Other sampling patterns (e.g., as shown in FIG. 4) can also be applied here. The k-space data may be averaged in a temporal direction to obtain an averaged k-space data (block 502), and is denoted by the arrow (a). In the process (b), the averaged k-space data may be used for determining a coil profile, denoted by block 503. Block 504 denotes an initial guess of the reconstructed images (g by default, one can assume that they are all zeros). In block 505, an approximate solution is obtained by taking data fidelity into consideration using a current solution, the acquired k-space data and the coil profile. The current solution is denoted by arrow (c1), which is the initial guess for the first iteration and the previous solution for the rest iterations. The acquired k-space data is denoted by arrow (c2), and the coil profile is denoted by arrow (c3). The approximate solution obtained in block 505 may be converted to an equivalent 3D tensor representation in block 506, where x and y denote the spatial dimension and t denotes the temporal direction. Block 507 shows the redundant Haar Wavelets of the 3D tensor in block 506, where LLL denotes the low frequency part and HHH denotes the high frequency part. Soft shrinkage and backward Wavelet transformation may be performed at arrow (f) to obtain the updated 3D tensor in block 508. The Dykstra's algorithm is applied at arrow (f) for improving the convergence of the algorithm. Block 509 tests whether the iterative algorithm converges. If yes, block 510 illustrates a solution, which is the equivalent representation of the 3D tensor in block 508; otherwise, the Nesterov's approach continues.

It is to be understood that embodiments of the present disclosure may be implemented in various forms of hardware, software, firmware, special purpose processors, or a combination thereof. In one embodiment, a software application program is tangibly embodied on a non-transitory computer-readable storage medium, such as a program storage device or computer-readable storage medium, with an executable program stored thereon. The application program may be uploaded to, and executed by, a machine comprising any suitable architecture.

Figure 6:
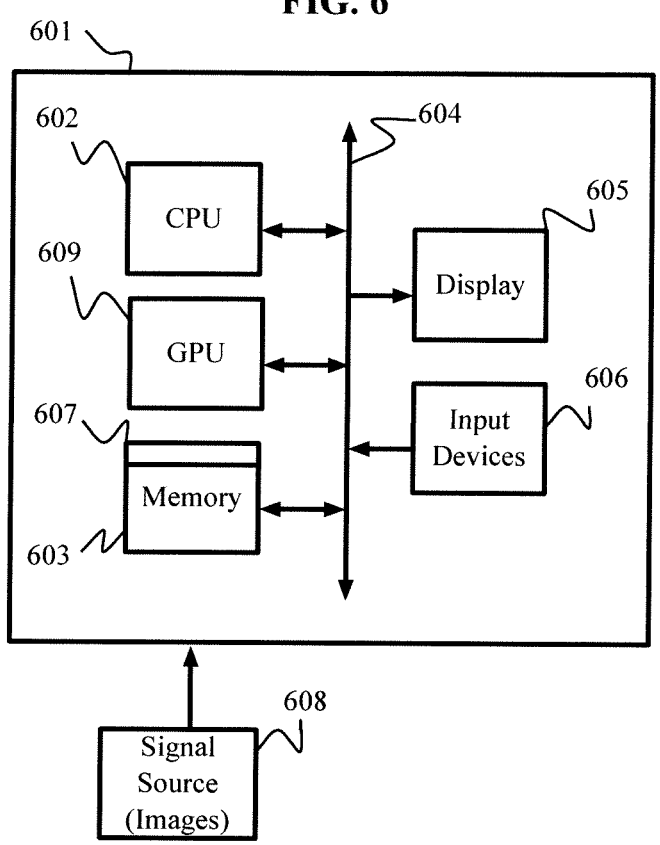
FIG. 6 is an exemplary system for dynamic cardiac MRI reconstruction according to an embodiment of the present disclosure.

Referring to FIG. 6, according to an embodiment of the present disclosure, a computer system (block 601) for image reconstruction using Haar wavelets includes, inter alia, a CPU (block 602), a memory (block 603) and an input/output (I/O) interface (block 604). The computer system (block 601) is generally coupled through the I/O interface (block 604) to a display (block 605) and various input devices (block 606) such as a mouse, keyboard, medical scanners, power equipment, etc. The display (block 605) may be implemented to display the rules, e.g., as the rules evolve during evaluation, ranking and refinement or as an output set of rules. The support circuits can include circuits such as cache, power supplies, clock circuits, and a communications bus. The memory (block 603) can include random access memory (RAM), read only memory (ROM), disk drive, tape drive, etc., or a combination thereof. The present invention can be implemented as a module (block 607) of the CPU or a routine stored in memory (block 603) and executed by the CPU (block 602) to process input data (block 608). For example, the data may include image information from a camera, which may be stored to memory (block 603) As such the computer system (block 601) is a general purpose computer system that becomes a specific purpose computer system when executing the routine of the present disclosure. The computer system (block 601) may further include a GPU (block 609) for image processing.

The computer platform (block 601) also includes an operating system and micro instruction code. The various processes and functions described herein may either be part of the micro instruction code or part of the application program (or a combination thereof) which is executed via the operating system. In addition, various other peripheral devices may be connected to the computer platform such as an additional data storage device and a printing device.

It is to be further understood that, because some of the constituent system components and method steps depicted in the accompanying figures may be implemented in software, the actual connections between the system components (or the process steps) may differ depending upon the manner in which the system is programmed. Given the teachings of the present disclosure provided herein, one of ordinary skill in the related art will be able to contemplate these and similar implementations or configurations of the present disclosure.

Having described embodiments for image reconstruction using Haar wavelets, it is noted that modifications and variations can be made by persons skilled in the art in light of the above teachings. It is therefore to be understood that changes may be made in embodiments of the present disclosure that are within the scope and spirit thereof.

What is claimed is:

1. An image reconstruction method comprising:
    receiving under-sampled k-space data;
    determining a data fidelity term of a first image of the under-sampled k-space data in view of a second image of the under-sampled k-space data, wherein a time component separates the first image and the second image;
    determining a spatial penalization on redundant Haar wavelet coefficients of the first image in view of the second image;
    determining a reconstruction of the first image according the data fidelity term and the spatial penalization, wherein the spatial penalization selectively penalizes temporal coefficients and a reconstructed image corresponding to the first image is output;
    averaging the under-sampled k-space data in a temporal direction to obtain an averaged k-space data; and
    determining a coil-profile based on the averaged k-space data,
    wherein determining the reconstruction of the first image further comprises:
    updating a solution based on the k-space data, the averaged k-space data, and the coil-profile in view of the data fidelity term;
    converting the solution into an equivalent three-dimensional tensor;
    updating the equivalent three-dimensional tensor using the spatial penalization; and
    outputting the reconstruction of the first image corresponding to the equivalent three-dimensional tensor updated using the spatial penalization.

2. The image reconstruction method of claim 1, wherein the first image and the second image are images of a heart, the method further comprising displaying the reconstructed image.

3. The image reconstruction method of claim 1, wherein the spatial penalization is a wavelet transformation.

4. The image reconstruction method of claim 1, wherein the reconstructed image is iteratively determined and controlled by a gradient descent.

5. An image reconstruction method using a weighted four dimension (4D) redundant Haar wavelet comprising:
    receiving under-sampled k-space data including 4D images;
    determining a reconstruction of an image of the 4D images by solving a minimization of a function including a data fidelity term and a penalty term controlling an incorporation of piecewise constant structures in spatial and temporal directions;
    averaging the under-sampled k-space data in a temporal direction to obtain an averaged k-space data and
    determining a coil-profile based on the averaged k-space data,
    wherein determining the reconstruction of the image further comprises:
    updating a solution based on the k-space data, the averaged k-space data, and the coil-profile in view of the data fidelity term;
    converting the solution into an equivalent three-dimensional tensor;
    updating the equivalent three-dimensional tensor using the spatial penalization; and
    outputting the reconstruction of the image corresponding to the equivalent three-dimensional tensor updated using the spatial penalization.

6. The image reconstruction method of claim 5, wherein the 4D images are images of a heart, the method further comprising displaying a reconstructed image of the heart.

7. The image reconstruction method of claim 5, wherein the spatial penalization is a wavelet transformation.

8. The image reconstruction method of claim 5, wherein the reconstruction of the image is iteratively determined and controlled by a gradient descent.

9. An image reconstruction method comprising:
    inputting k-space data;
    averaging the k-space data in a temporal direction to obtain an averaged k-space data;
    determining a coil-profile based on the averaged k-space data;
    updating a solution based on the k-space data, the averaged k-space data, and the coil-profile in view of a data fidelity term;

converting the solution into an equivalent three-dimensional tensor;

updating the equivalent three-dimensional tensor using a wavelet transformation; and outputting a reconstructed image corresponding to the equivalent three-dimensional tensor updated using the wavelet transformation.

10. The image reconstruction method of claim 9, wherein the k-space data includes images of a heart, the method further comprising displaying the reconstructed image.

11. The image reconstruction method of claim 9, wherein the wavelet transformation is a spatial penalization.

12. The image reconstruction method of claim 9, wherein the steps of updating the solution, converting the solution, updating the equivalent three-dimensional tensor, and outputting the reconstructed image are iteratively performed according to a gradient descent.

13. The image reconstruction method of claim 12, further comprising outputting the reconstructed image upon determining a convergence of the gradient descent.

* * * * *